(12) United States Patent
Yamaguchi et al.

(10) Patent No.: US 8,878,141 B2
(45) Date of Patent: Nov. 4, 2014

(54) DRAWING APPARATUS, AND METHOD OF MANUFACTURING ARTICLE

(71) Applicant: Canon Kabushiki Kaisha, Tokyo (JP)

(72) Inventors: Wataru Yamaguchi, Utsunomiya (JP); Takahiro Matsumoto, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/719,702

(22) Filed: Dec. 19, 2012

(65) Prior Publication Data

US 2013/0168569 A1    Jul. 4, 2013

(30) Foreign Application Priority Data

Dec. 28, 2011  (JP) ................. 2011-289885

(51) Int. Cl.
*G21K 5/04* (2006.01)
*H01J 37/317* (2006.01)
*H01J 37/304* (2006.01)

(52) U.S. Cl.
CPC ......... *G21K 5/04* (2013.01); *H01J 2237/31774* (2013.01); *H01J 37/3177* (2013.01); *H01J 2237/24578* (2013.01); *H01J 2237/31728* (2013.01); *H01J 2237/31767* (2013.01); *H01J 37/3045* (2013.01)
USPC ....................................... 250/395

(58) Field of Classification Search
CPC .............................. G21K 5/04; H01J 37/3045
USPC .................. 250/395, 400, 491.1, 492.3
See application file for complete search history.

(56) References Cited

U.S. PATENT DOCUMENTS

| | | | |
|---|---|---|---|
| 2005/0040343 A1* | 2/2005 | Sohda et al. | 250/492.1 |
| 2008/0054188 A1* | 3/2008 | Usa et al. | 250/400 |

FOREIGN PATENT DOCUMENTS

| | | | |
|---|---|---|---|
| JP | 4026872 A | 10/2007 | |
| JP | 4327434 A | 6/2009 | |

* cited by examiner

*Primary Examiner* — David Porta
*Assistant Examiner* — Faye Boosalis
(74) *Attorney, Agent, or Firm* — Rossi, Kimms & McDowell LLP

(57) ABSTRACT

The present invention provides a drawing apparatus which performs drawing on a substrate with a plurality of charged particle beams, the apparatus including a stage configured to hold the substrate and to be moved, a charged particle optical system including a deflector configured to deflect the plurality of charged particle beams, a detector configured to detect a charged particle arrived thereat by causing a charged particle beam to impinge on a mark including a plurality of mark elements formed on one of the substrate and the stage, and a processor configured to perform a process of obtaining a position of the mark.

6 Claims, 9 Drawing Sheets

DRAWING APPARATUS, AND METHOD OF MANUFACTURING ARTICLE

BACKGROUND OF THE INVENTION

1. Field of the Invention

The present invention relates to a drawing apparatus, and a method of manufacturing an article.

2. Description of the Related Art

In recent years, with an increase in packing density and miniaturization of semiconductor integrated circuits, the line width of a circuit pattern has become very small, so further miniaturization of a pattern (resist pattern) formed (drawn) on a substrate is required in a lithography process. As one of techniques which achieves such pattern miniaturization, a drawing apparatus (charged particle beam drawing apparatus) which performs drawing on a substrate with a charged particle beam is known.

A multi-charged particle beam drawing apparatus generally focuses a plurality of charged particle beams on a substrate, and moves a stage which holds the substrate and the charged particle beams relative to each other, thereby drawing a pattern on the substrate. Therefore, to draw a fine pattern, it is important to accurately align the substrate and the charged particle beams relative to each other.

In aligning a charged particle beam and a substrate with each other in a drawing apparatus, secondary electrons from an alignment mark set (formed) on the substrate are detected by a detector while the charged particle beam is deflected relative to the alignment mark, thereby obtaining the position of the alignment mark. Note that the range of deflection of each of a plurality of charged particle beams is narrower in a multi-charged particle beam drawing apparatus than in a single-charged particle beam drawing apparatus which performs drawing on a substrate with one charged particle beam. Therefore, if the dimension (deflection distance) of each charged particle beam in the direction in which an alignment mark is measured within the range of deflection of this charged particle beam is smaller than the dimension (width) of the alignment mark in the direction in which it is measured, the alignment mark cannot be measured using one charged particle beam alone. Hence, Japanese Patent Nos. 4026872 and 4327434 propose techniques of measuring alignment marks in drawing apparatuses.

Japanese Patent No. 4026872 discloses a drawing apparatus which measures an alignment mark by simultaneously deflecting a plurality of charged particle beams arrayed in the direction in which the alignment mark is measured. In the drawing apparatus disclosed in Japanese Patent No. 4026872, the interval between charged particle beams in the direction in which the alignment mark is measured is set equal to an integer multiple of the pitch between pattern elements (mark elements) which form the alignment mark. Upon this operation, detection signals (secondary electrons) detected by a detector are combined with each other while a plurality of charged particle beams are simultaneously deflected relative to the alignment mark to reduce the influence of distortion and random noise of the detection signals, thereby accurately measuring the alignment mark.

Also, Japanese Patent No. 4327434 discloses two methods for measuring an alignment mark. The first method serves to detect secondary electrons from an alignment mark by a detector while sequentially deflecting a plurality of charged particle beams in accordance with the property of the alignment mark. In the first method, the effective deflection distance of each charged particle beam in the direction in which the alignment mark is measured is set large, and secondary electrons are individually detected by a detector while the charged particle beams are sequentially deflected relative to the alignment mark, thereby allowing measurement of the alignment mark. The second method serves to measure an alignment mark as the deflection distance of each charged particle beam in the direction in which the alignment mark is measured is set large using a measuring deflector for the alignment mark. In the second method, a measuring deflector for the alignment mark is provided separately from a pattern drawing deflector, thereby allowing measurement of the alignment mark with one charged particle beam alone.

However, the pitch between pattern elements which form the alignment mark, and the interval between charged particle beams in the direction in which the alignment mark is measured are not always equal in periodicity. This is because in a process of manufacturing a device, the alignment mark is commonly used even in an apparatus (for example, an exposure apparatus) other than a drawing apparatus, so the pitch between pattern elements cannot be determined only for the sake of convenience of the drawing apparatus. Therefore, a shift may occur in the relative positional relationship between the charged particle beams and the alignment mark (pattern elements), thus making the two ends (their positions) of each of some pattern elements fall outside the range of deflection of each charged particle beam.

Also, when one pattern element (the positions of its two ends) is measured using at least two charged particle beams, as the number of charged particle beams increases, the effective deflection distance of each charged particle beam increases more than when the pattern element is measured using one charged particle beam alone. Especially when the spot size of the charged particle beam is smaller than the length of the alignment mark in the non-measurement direction, it is necessary to measure a plurality of portions in the non-measurement direction for one pattern element, and obtain their integral, in order to reduce an error due to factors associated with the edge flatness of the pattern elements. This prolongs the measurement time of the alignment mark, thus lowering the throughput of the drawing apparatus.

Also, in the drawing apparatus, due, for example, to manufacturing errors of a charged particle optical system, differences may occur in the incident angles (irradiation angles) or intensities (irradiation intensities) of respective charged particle beams. Therefore, when one pattern element is measured using at least two charged particle beams, distortions or variations may occur in the waveforms of detection signals obtained from respective charged particle beams, thus degrading the measurement accuracy of the alignment mark.

FIG. 9 is a view for explaining measurement of an alignment mark in the related art technique. FIG. 9 shows the positional relationship between five charged particle beams CPa to CPe and two pattern elements PEa and PEb which form the alignment mark in the drawing apparatus, and detection signals (their waveforms) obtained by detecting secondary electrons from the pattern elements PEa and PEb, respectively.

Referring to FIG. 9, two ends (positions) M1 and M1' of the pattern element PEa fall within the range of deflection of the charged particle beam CPa (a range defined by dotted lines P1 and P2), so the position of the pattern element PEa can be measured by deflecting the charged particle beam CPa. In such a case, compared to the case wherein one pattern element is measured using a plurality of charged particle beams, the number of charged particle beams required for measurement is smaller, and the deflection distance of each charged particle beam is smaller, so the alignment mark can be measured in a shorter time. Also, since one pattern element is measured using one charged particle beam, the position of the pattern element PEa can be accurately measured free from the influence of differences in incident angle and intensity of respective charged particle beams (that is, free from the occurrence of distortions or variations in the waveforms of detection signals).

On the other hand, two ends (positions) M2 and M2' of the pattern element PEb are positioned across the range of deflection of a charged particle beam PEd (a range defined by dotted lines P4 and P5) and that of a charged particle beam PEe (a range defined by dotted lines P5 and P6). In such a case, the pattern element PEb must be measured while the charged particle beams PEd and PEe are sequentially deflected. This lowers the throughput due to an increase in number of charged particle beams required to measure pattern elements, or the measurement accuracy due to differences in incident angle and intensity of respective charged particle beams.

Note that as disclosed in Japanese Patent No. 4026872, when a plurality of charged particle beams are simultaneously deflected, it is possible to prevent a decrease in throughput due to an increase in number of charged particle beams required to measure pattern elements. However, the pitch between pattern elements and the interval between charged particle beams are not always proportional to each other, as described above. Therefore, detection signals having different waveforms are obtained in accordance with the amount of shift between the irradiation positions of the charged particle beams and the positions of the pattern elements, and an error may occur in the waveform obtained by combining these detection signals with each other, thus degrading the measurement accuracy.

Also, as disclosed in Japanese Patent No. 4327434, when a plurality of charged particle beams are sequentially deflected in accordance with the property of the alignment mark (pattern elements), a detection signal is detected for each charged particle beam, so the measurement accuracy degrades due to neither distortions nor variations of the waveforms of the detection signals. However, because at least two charged particle beams are sequentially deflected relative to the two ends of the pattern element, the effective deflection distance of each charged particle beam increases, so the measurement time of the alignment mark increases, thus lowering the throughput of the drawing apparatus, as described above. Due to differences in incident angle and intensity of respective charged particle beams, distortions or variations may occur in the waveforms of detection signals obtained from these charged particle beams, thus degrading the measurement accuracy of the alignment mark.

Moreover, as disclosed in Japanese Patent No. 4327434, when a measuring deflector for the alignment mark is used, the alignment mark (pattern elements) can be measured using one charged particle beam alone, so neither the throughput nor the measurement accuracy lowers in principle. This leads to degradation in measurement accuracy and rise in cost due to an increase in aberration.

SUMMARY OF THE INVENTION

The present invention provides, for example, a drawing apparatus advantageous in measuring of a position of a mark According to one aspect of the present invention, there is provided a drawing apparatus which performs drawing on a substrate with a plurality of charged particle beams, the apparatus including a stage configured to hold the substrate and to be moved, a charged particle optical system including a deflector configured to deflect the plurality of charged particle beams, a detector configured to detect a charged particle arrived thereat by causing a charged particle beam to impinge on a mark including a plurality of mark elements formed on one of the substrate and the stage, and a processor configured to perform a process of obtaining a position of the mark, wherein the processor is configured to control the stage, the charged particle optical system, and the detector such that a position of a first mark element is measured while two ends of the first mark element fall within a range of deflection by the deflector with respect to a first charged particle beam among the plurality of charged particle beams, and a position of a second mark element, different from the first mark element, is measured while two ends of the second mark element fall within a range of deflection by the deflector with respect to a second charged particle beam, among the plurality of charged particle beams, closer to the second mark element than the first charged particle beam.

Further features of the present invention will become apparent from the following description of exemplary embodiments with reference to the attached drawings.

DESCRIPTION OF THE EMBODIMENTS

Figure 1:
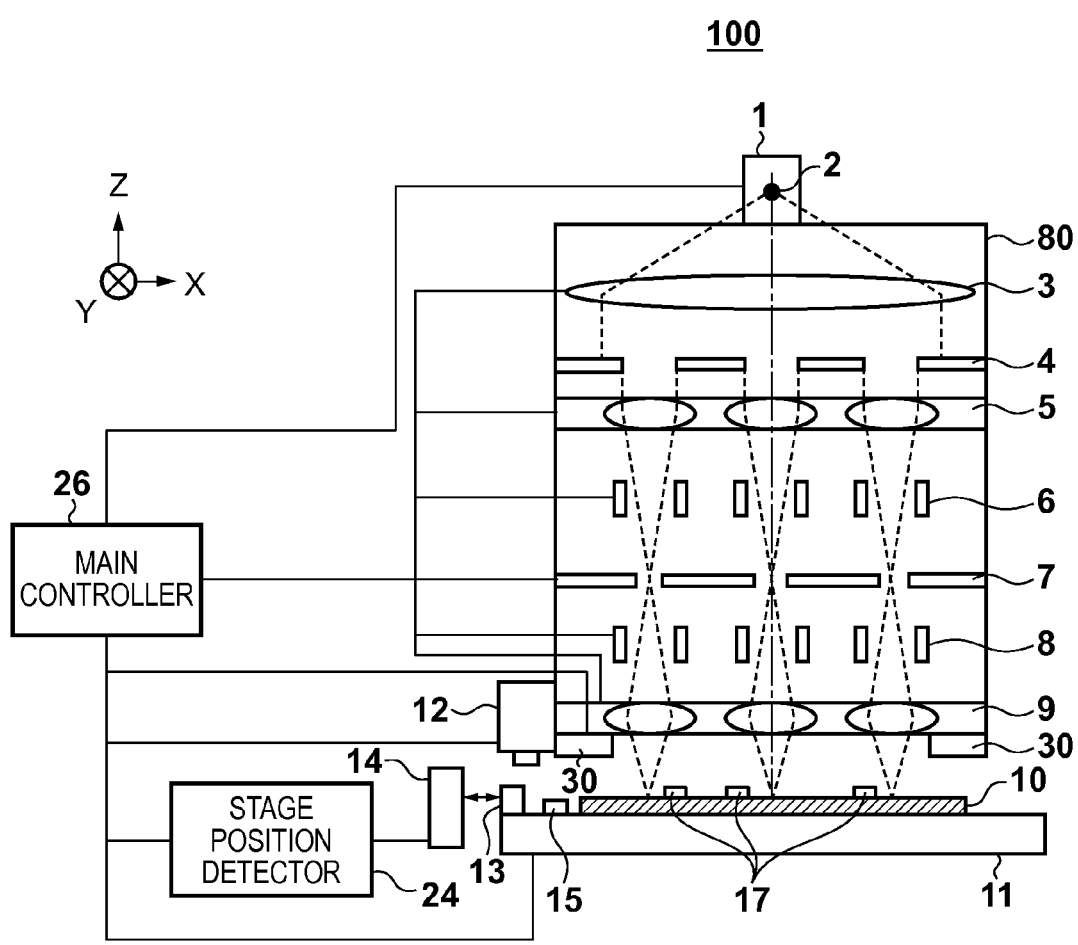
FIG. 1 is a view showing the configuration of a drawing apparatus according to an aspect of the present invention.

Preferred embodiments of the present invention will be described below with reference to the accompanying drawings. Note that the same reference numerals denote the same members throughout the drawings, and a repetitive description thereof will not be given.

<First Embodiment>

FIG. 1 is a view showing the configuration of a drawing apparatus 100 according to an aspect of the present invention. The drawing apparatus 100 serves as a lithography apparatus which draws a pattern on a substrate using a charged particle beam (electron beam), and is actually used as a multi-charged particle beam drawing apparatus (a drawing apparatus which performs drawing using a plurality of charged particle beams). The drawing apparatus 100 includes an electron gun 1, collimator lens 3, aperture array 4, electrostatic lenses 5 and 9, blanking deflectors 6, blanking aperture 7, deflectors 8, and stage 11. Note that the collimator lens 3, aperture array 4, electrostatic lenses 5 and 9, blanking deflectors 6, blanking aperture 7, and deflectors 8 constitute a charged particle optical system which guides charged particle beams onto a substrate 10. Also, to align the charged particle beams and the substrate 10 with each other, the drawing apparatus 100 includes an alignment optical system 12, distance measuring interferometer 14, stage position detector 24, main controller 26, and electron detector 30.

Referring to FIG. 1, the electron gun 1 forms a crossover image 2. A diverging charged particle beam from the crossover image 2 is converted into a nearly collimated charged particle beam via the collimator lens 3, and enters the aperture array 4. The aperture array 4 includes a plurality of circular apertures arrayed in a matrix, and splits the charged particle beam having passed through the collimator lens 3 into a plurality of charged particle beams.

The charged particle beams having passed through the aperture array 4 enter the electrostatic lens 5 formed by a plurality of electrode plates (for example, three electrode plates) having circular apertures, respectively. The blanking aperture 7 including a plurality of minute apertures arrayed in a matrix is set at the position at which the charged particle beams having passed through the electrostatic lens 5 form crossover images for the first time.

The blanking deflectors 6 and blanking aperture 7 perform a blanking operation of controlling ON/OFF of the irradiation of the substrate 10 with the charged particle beams in cooperation with each other. The charged particle beams having passed through the blanking aperture 7 form, through the electrostatic lens 9, images corresponding to the crossover image 2 on the substrate 10 held by the stage 11.

In drawing a pattern on the substrate 10, the charged particle beams having passed through the blanking aperture 7 are deflected (scanned) by the deflectors 8, and undergo ON/OFF control of the irradiation of the substrate 10 by the blanking deflectors 6 and blanking aperture 7. Also, in measuring the position of the substrate 10 using the charged particle beams, secondary electrons from the substrate 10 (alignment marks 17) are detected by the electron detector 30 while the charged particle beams are deflected (scanned) by the deflectors 8 relative to alignment marks 17 set (formed) on the substrate 10.

The electron detector 30 is set near the substrate 10. The electron detector 30 detects charged particles, such as secondary electrons, reflected as the charged particle beams impinge on the mark (for example, the alignment mark 17 or the reference mark) set on the substrate 10 or stage 11. The electron detector 30 is set on the lower surface of a charged particle optical system 80, for example, on the electrostatic lens 9, and above the substrate 10. Upon this operation, the electron detector 30 can accurately detect secondary electrons from the substrate 10, and can therefore accurately obtain the position of the alignment mark 17. Note that in place of the electron detector 30, a Faraday cup may be set near the substrate 10 or around the charged particle optical system 80 to detect the amount of charge of secondary electrons from the substrate 10, thereby obtaining the position of the alignment mark 17.

The stage 11 serves as a mechanism which moves upon holding the substrate 10. The stage 11 includes, for example, an X-stage on which the substrate 10 is placed, and a Y-stage on which the X-stage is placed. Also, a reference plate 15 including a reference mark formed on it is set on the X-stage at a position different from that at which the substrate 10 is placed. Moreover, an X-axis mirror 13 is set at one end of the X-stage in the X-direction. The Y-stage serves to position the substrate 10 in the Y-direction (a direction perpendicular to the paper surface of FIG. 1) within a plane perpendicular to the optical axis of the charged particle optical system 80. The X-stage serves to position the substrate 10 in the X-direction perpendicular to the Y-axis within a plane perpendicular to the optical axis of the charged particle optical system 80. Note that a Z stage for positioning the substrate 10 in the Z-direction parallel to the optical axis of the charged particle optical system 80 may be placed on the X-stage. The main controller 26 controls the position of the stage 11.

The distance measuring interferometer 14 splits laser light emitted by a laser light source into measurement light and reference light, guides the measurement light to the X-axis mirror 13, and guides the reference light to a reference mirror. The distance measuring interferometer 14 then superposes the measurement light reflected by the X-axis mirror 13, and the reference light reflected by the reference mirror on each other to generate interference between them, and detects the intensity of the interfering light using a detector. Note that the measurement light and the reference light are set to have frequencies with a very small difference $\Delta f$, so a beat signal obtained upon a change in frequency from $\Delta f$ in accordance with the moving velocity of the X-axis mirror 13 in the X-direction is output from the detector. The beat signal is processed by the stage position detector 24, and the amount of change in optical path length of the measurement light with reference to the optical path length of the reference light, that is, the X-coordinate of the X-axis mirror 13 (the position of the stage 11 in the X-direction) with reference to the reference mirror is accurately detected at a high resolution. Similarly, the Y-coordinate of a Y-axis mirror set at one end of the stage 11 in the Y-direction with reference to the reference mirror is accurately detected at a high resolution by a distance measuring interferometer (not shown) for detecting the position of the stage 11 in the Y-direction.

The alignment optical system 12 guides alignment light to the alignment marks 17 and the reference mark formed on the reference plate 15. The alignment optical system 12 forms an image of the light reflected by each mark on the sensor to detect an image of this mark, thereby obtaining the position of this mark relative to the optical axis of the alignment optical system 12.

The main controller 26 includes, for example, a CPU and memory and controls the overall drawing apparatus 100 (its operation). The main controller 26 controls each unit of the drawing apparatus 100 to perform, for example, a drawing process of drawing a pattern on the substrate 10, and an alignment process of aligning the charged particle beams and the substrate 10 with each other. The main controller 26 also functions as a processor which performs a process of obtaining the position of the alignment mark 17 on the substrate 10 in the alignment process. For example, the main controller 26 calculates a mark signal (discrete signal sequence) serving as a signal indicating the amount of secondary electrons corresponding to the amount of deflection of the charged particle beam, based on the detection result obtained by the electron detector 30 (that is, data indicating the amount of secondary electrons).

Figure 2:
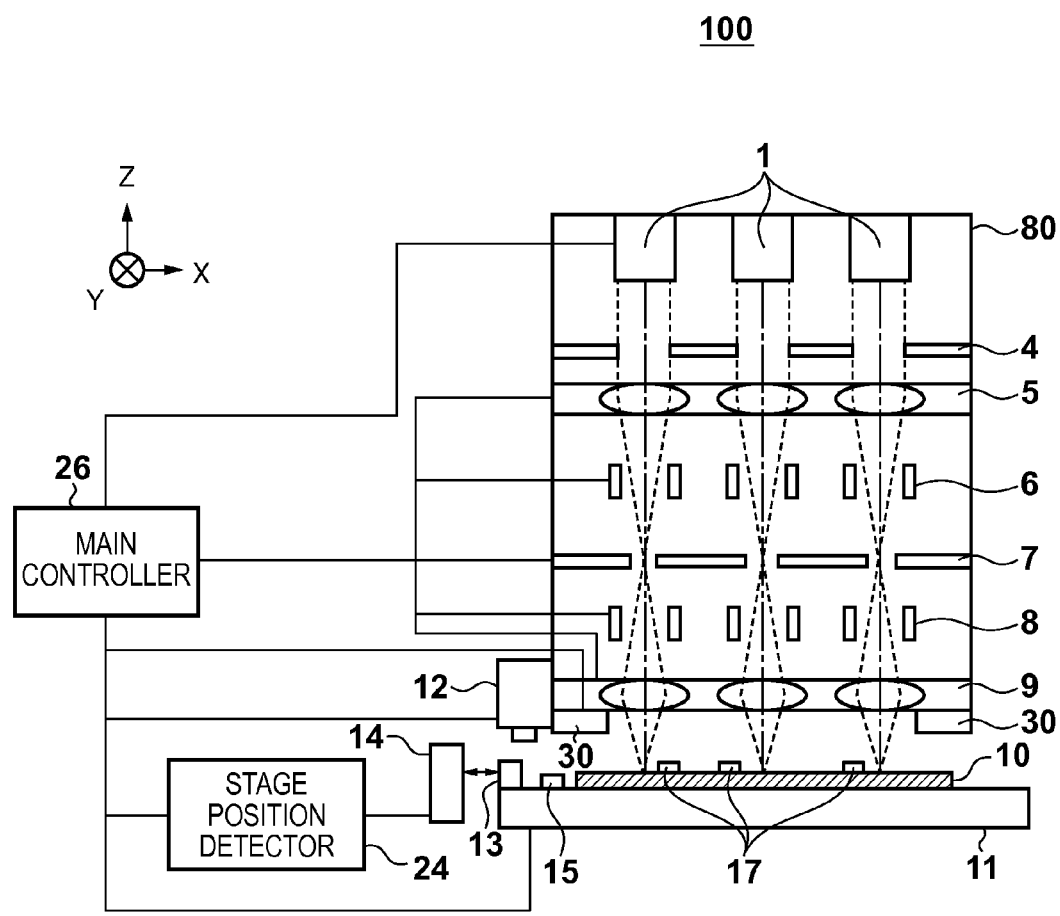
FIG. 2 is a view showing the configuration of a drawing apparatus according to another aspect of the present invention.

Note that the drawing apparatus 100 is not limited to a single-source drawing apparatus which splits a charged particle beam from one electron gun 1 into a plurality of charged particle beams, and irradiates the substrate 10 with the plurality of charged particle beams, as shown in FIG. 1. The drawing apparatus 100 may serve as, for example, a multi-source drawing apparatus which irradiates the substrate 10 with charged particle beams from a plurality of electron guns 1, respectively, as shown in FIG. 2, or a multi-column drawing apparatus.

In the drawing apparatus 100, a measurement charged particle beam is set in obtaining the position of the alignment mark 17. More specifically, one of the plurality of charged particle beams having passed through the aperture array 4 is selected and set as a measurement charged particle beam for each of a plurality of pattern elements (mark elements) which form the alignment mark 17. The stage 11 is then positioned so that the two ends of each pattern element fall within the range of deflection of the measurement charged particle beam by the deflector 8 (that is, the measurement charged particle beam and each pattern element are aligned relative to each other). Also, secondary electrons from each pattern element are detected by the electron detector 30 while the measurement charged particle beam is deflected by the deflector 8, thereby specifying the position of each pattern element (the positions of its two ends). The position of the alignment mark 17 is obtained based on the position of each pattern element, and the relative positional relationship between the measurement charged particle beam and the plurality of pattern elements which form the alignment mark 17. Note that the measurement charged particle beam means a charged particle beam used in obtaining the position of the alignment mark 17 (each pattern element which forms it), and is selected from a plurality of charged particle beams used to draw a pattern.

Upon this operation, the drawing apparatus 100 can keep the effective deflection distance of the measurement charged particle beam small (that is, suppress prolongation of the measurement time of each pattern element), thereby obtaining the position of the alignment mark 17 in a short time. Also, since the drawing apparatus 100 deflects one charged particle beam for one pattern element, degradation in measurement accuracy due to differences in incident angle and intensity of respective charged particle beams can be avoided to accurately obtain the position of the alignment mark 17.

Figure 3:
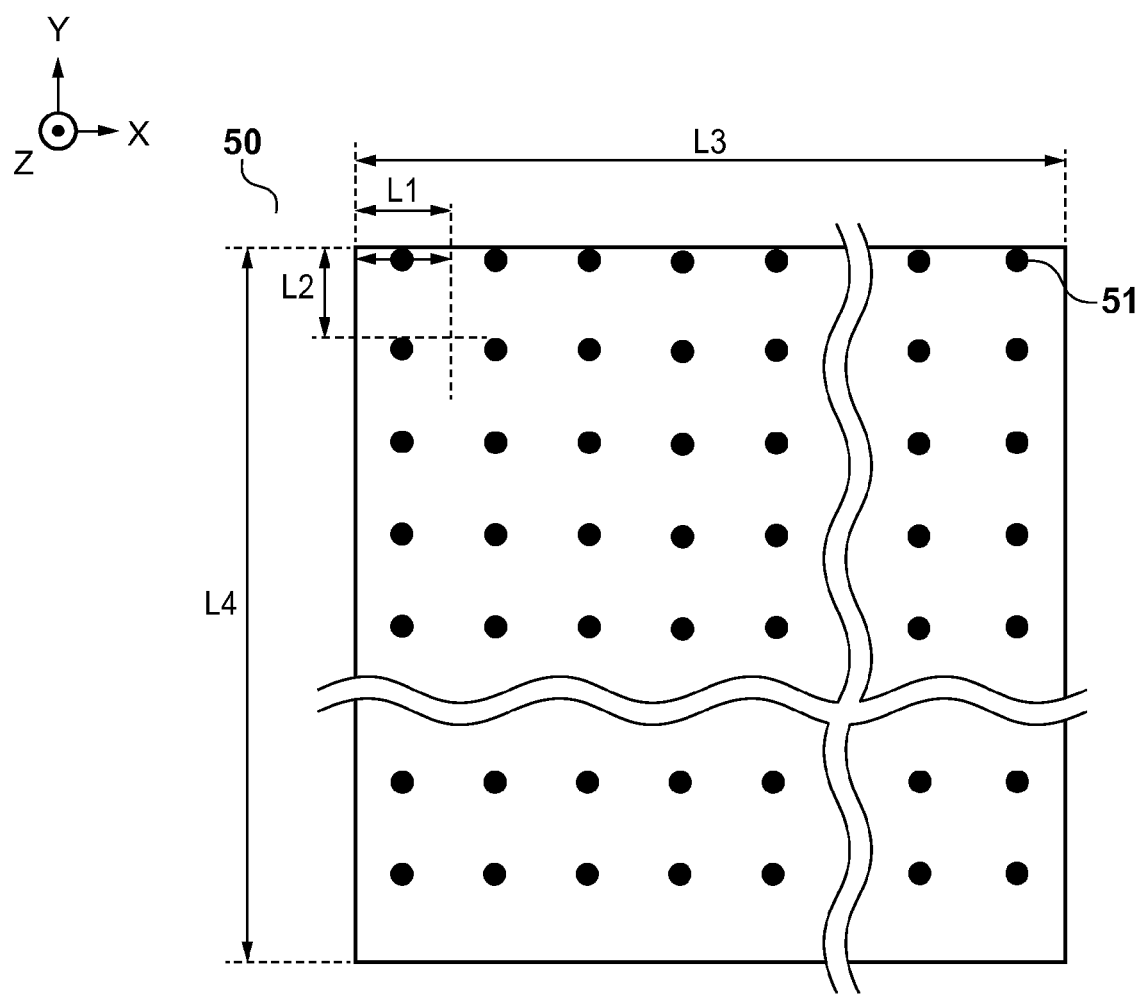
FIG. 3 is a view for explaining the positions of a plurality of charged particle beams on a substrate in the drawing apparatus shown in FIG. 1.

The positions of a plurality of charged particle beams 51 on the substrate 10 in the drawing apparatus 100 will be described with reference to FIG. 3. A drawing region 50 means a region in which a pattern is drawn with the plurality of charged particle beams 51, and is a rectangular region having a dimension L3 in the X-direction and a dimension L4 in the Y-direction. The plurality of charged particle beams 51 are equidistantly positioned at a pitch defined by a distance L1 in the X-direction and a distance L2 in the Y-direction within the drawing region 50. While the stage 11 continuously moves by the distance L2 in the Y-direction, the deflector 8 repeatedly deflects the charged particle beams 51 on the substrate 10 in the X-direction within the range of the distance L1, thereby drawing a pattern in the drawing region 50. Note that the moving velocity of the stage 11 is determined based on the sensitivity of the resist applied on the substrate 10, and the current density of the charged particle beam 51, and the distance L1 is determined based on the range of deflection of the charged particle beam 51 by the deflector 8.

Figure 4:
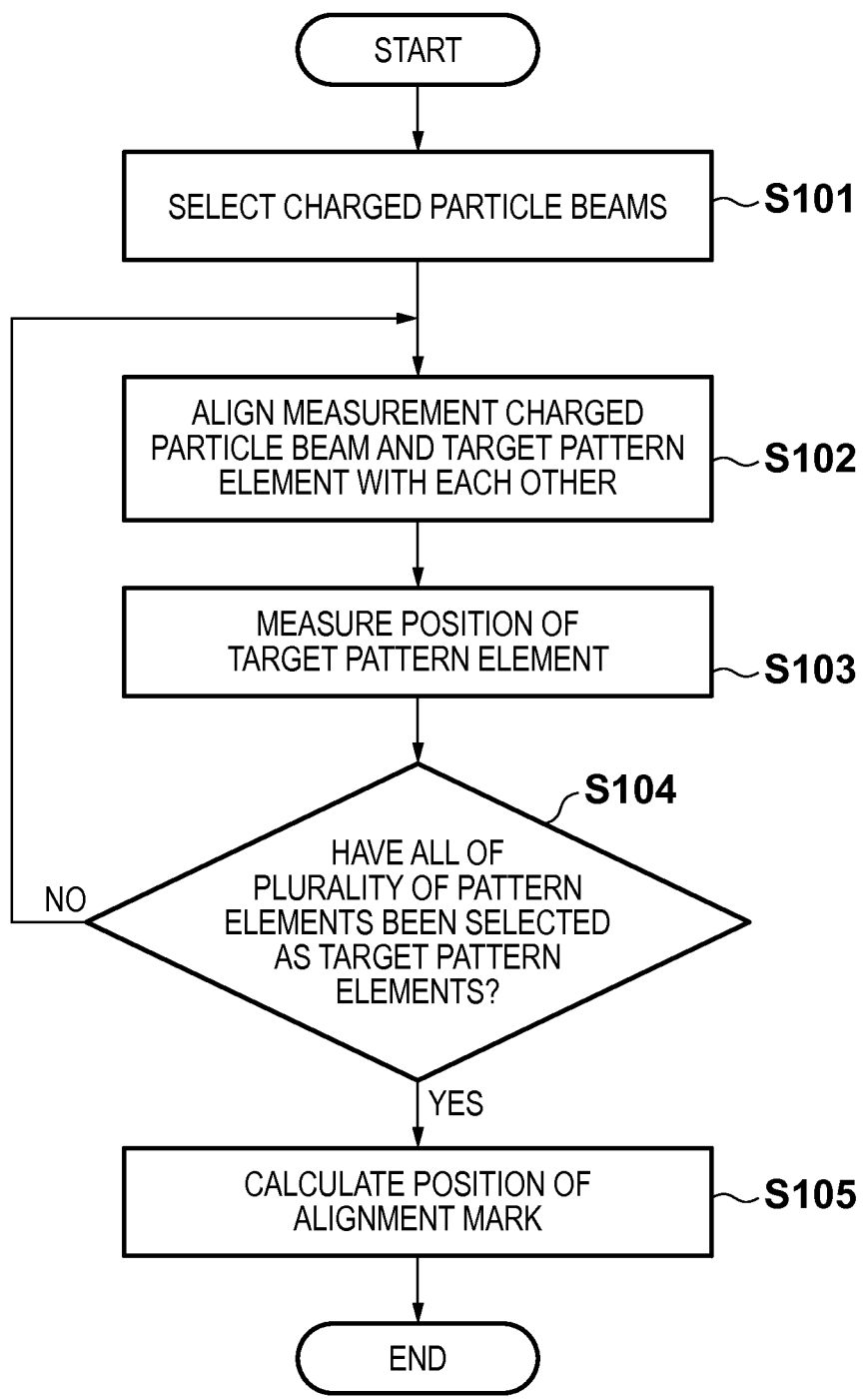
FIG. 4 is a flowchart for explaining a process of obtaining the position of an alignment mark in the drawing apparatus shown in FIG. 1.

An alignment process and, more particularly, a process of obtaining the position of the alignment mark 17 in the first embodiment will be described with reference to FIG. 4. The main controller 26 performs this process by controlling each unit of the drawing apparatus 100 as a whole, as described above.

In step S101, at least two charged particle beams for measuring a plurality of pattern elements which form the alignment mark 17 are selected from the plurality of charged particle beams 51 having passed through the aperture array 4.

In step S102, a measurement charged particle beam and a target pattern element selected from the plurality of pattern elements which form the alignment mark 17 are aligned with each other. More specifically, first, of at least two charged particle beams selected in step S101, one charged particle beam close to the target pattern element is set as a measurement charged particle beam for the target pattern. The stage 11 is then positioned so that the two ends of the target pattern element fall within the range of deflection of the measurement charged particle beam by the deflector 8. Note that the target pattern element means a pattern element at a position to be measured.

In step S103, the position of the target pattern element is measured. More specifically, first, secondary electrons from the target pattern element are detected by the electron detector 30 while the measurement charged particle beam is deflected by the deflector 8, as the stage 11 is positioned. The positions of the two ends of the target pattern element are then specified (that is, the position of the target pattern element is measured) based on the detection result obtained by the electron detector 30.

In step S104, it is determined whether all of the plurality of pattern elements which form the alignment mark 17 have been selected as target pattern elements. If it is determined in step S104 that not all of the plurality of pattern elements have been selected as target pattern elements, a new target pattern element is selected from the plurality of remaining pattern elements, and the process returns to step S102. On the other hand, if it is determined in step S104 that all of the plurality of pattern elements which form the alignment mark 17 have been selected as target pattern elements, the process advances to step S105. Note that the position of the alignment mark 17 can also often be obtained from the positions of some of the plurality of pattern elements which form the alignment mark 17. In such a case, it is only necessary to determine in step S104 whether all pattern elements required to obtain the position of the alignment mark 17 have been selected as target pattern elements.

In step S105, the position of the alignment mark 17 is calculated. More specifically, the position of the alignment mark 17 is calculated based on the position of each target pattern element (that is, each of the plurality of pattern elements) obtained in step S103, and the positional relationship between the measurement charged particle beam and the plurality of pattern elements which form the alignment mark 17. At this time, the positional relationship between the measurement charged particle beam and the plurality of pattern elements can be obtained from the position of the measurement charged particle beam, and the amount of movement of the stage 11, which is required to position the stage 11 in step S102.

In this manner, in this embodiment, one of the plurality of charged particle beams 51 is set as a measurement charged particle beam for each of the plurality of pattern elements which form the alignment mark 17. Also, for each of the plurality of pattern elements, the stage 11 is sequentially positioned so that the two ends of the pattern element fall within the range of deflection of the measurement charged particle beam by the deflector 8, thereby measuring the position of the pattern element while the measurement charged particle beam is deflected. The position of the alignment mark 17 is then calculated based on the position of each pattern element, and the positional relationship between the measurement charged particle beam and the plurality of pattern elements.

Steps S101 and S102 in the process of obtaining the position of the alignment mark 17 will be described in detail. In step S101, at least two charged particle beams for measuring a plurality of pattern elements which form the alignment mark 17 are selected from the plurality of charged particle beams 51 having passed through the aperture array 4, as described above. At this time, a charged particle beam is selected in accordance with the positional relationship between the charged particle beams 51 and the pattern elements from the positions of the plurality of charged particle beams 51 (the irradiation positions of the charged particle beams 51) on the substrate 10, and those of the plurality of pattern elements which form the alignment mark 17. Also, in step S102, one of at least two charged particle beams selected in step S101 is set as a measurement charged particle beam for each pattern element, as described above. At this time, of at least two charged particle beams, a charged particle beam close to the pattern element and, more specifically, a charged particle beam closest to the pattern element is preferably set as a measurement charged particle beam. This makes it possible to minimize the time taken for the stage 11 to be positioned (the amount of movement of the stage 11). This is advantageous in terms of the throughput of the drawing apparatus 100.

The positions of the plurality of charged particle beams 51 on the substrate 10 can be obtained by irradiating the reference mark formed on the reference plate 15 with the charged particle beams 51, and detecting secondary electrons from this reference mark by the electron detector 30. Also, the positions of the alignment mark 17 and the plurality of elements which form the alignment mark 17 can be obtained based on the measurement result of the alignment mark 17 obtained by the alignment optical system 12, and the design values of the plurality of pattern elements which form the alignment mark 17.

When one charged particle beam is selected and set as a measurement charged particle beam without taking into consideration the relative positional relationship between the charged particle beams and the pattern elements, the amount of positional shift between the measurement charged particle beam and the plurality of pattern elements which form the alignment mark 17 becomes larger. Therefore, in positioning the stage 11 (step S102), the amount of movement of the stage 11 becomes larger, so the time taken for the stage 11 to be positioned prolongs, thus lowering the throughput of the drawing apparatus 100. On the other hand, in the drawing apparatus 100, one charged particle beam is selected and set as a measurement charged particle beam in accordance with the relative positional relationship between the charged particle beams and the pattern elements, so that the stage 11 moves only in a small amount in positioning the stage 11. This makes it possible to prevent the throughput of the drawing apparatus 100 from lowering, as described above.

Figure 5A:
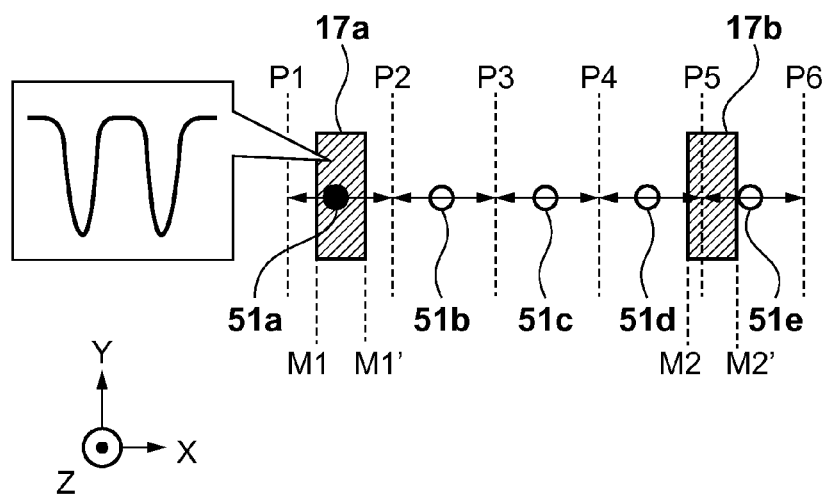
FIGS. 5A and 5B are views for explaining a process of obtaining the position of an alignment mark formed by two pattern elements.
Figure 5B:
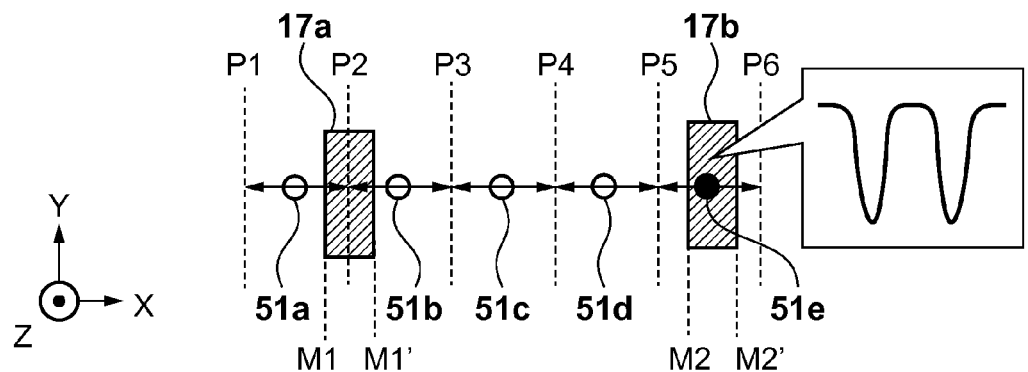

A process of obtaining the position of an alignment mark 17 formed by two pattern elements 17a and 17b in the drawing apparatus 100 will be described herein with reference to FIGS. 5A and 5B. In this case, the process of obtaining the position of the alignment mark 17 includes a process of measuring the pattern element (first mark element) 17a, and a process of measuring the pattern element (second mark element) 17b. Also, five charged particle beams 51a, 51b, 51c, 51d, and 51e are selected as at least two charged particle beams for measuring the pattern elements 17a and 17b. FIGS. 5A and 5B show the positional relationship between the five charged particle beams 51a to 51e and the two pattern elements 17a and 17b which form the alignment mark 17. Referring to FIGS. 5A and 5B, charged particle beams which do not strike the substrate 10 upon a blanking operation are indicted by open circles, and other charged particle beams which strike the substrate 10 upon the blanking operation are indicated by filled circles. Note that the range of deflection of the charged particle beam 51a is defined by dotted lines P1 and P2, that of the charged particle beam 51b is defined by dotted lines P2 and P3, and that of the charged particle beam 51c is defined by dotted lines P3 and P4. Similarly, the range of deflection of the charged particle beam 51d is defined by dotted lines P4 and P5, and that of the charged particle beam 51e is defined by dotted lines P5 and P6.

First, the charged particle beam 51a is set as a measurement charged particle beam (first charged particle beam) for the pattern element 17a, as shown in FIG. 5A. Then, the stage 11 is positioned so that two ends M1 and M1' of the pattern element 17a fall within the range of deflection of the charged particle beam 51a, and secondary electrons from the pattern element 17a are detected by the electron detector 30 while the charged particle beam 51a is deflected. At this time, of the five charged particle beams 51a to 51e, the charged particle beam 51a closest to the pattern element 17a is preferably set as a measurement charged particle beam. This minimizes the time taken for the stage 11 to be positioned (the amount of movement of the stage 11). Also, since one pattern element 17a is measured using one charged particle beam 51a, the measurement operation is influenced by neither the incident angles nor intensities of the charged particle beams 51a to 51e. This makes it possible to accurately obtain the position of the pattern element 17a free from the occurrence of distortions or variations in the waveforms of detection signals output from the electron detector 30 (see FIG. 5A).

Next, of the charged particle beams 51b to 51e other than the charged particle beam 51a, a charged particle beam closer to the pattern element 17b than the charged particle beam 51a is set as a measurement charged particle beam for the pattern element 17b, at the end of the process of measuring the pattern element 17a. At this time, of the charged particle beams 51b to 51e, the charged particle beam 51e closest to the pattern element 17b is preferably set as a measurement charged particle beam (second charged particle beam) for the pattern element 17b. Then, the stage 11 is positioned so that two ends M2 and M2' of the pattern element 17b fall within the range of deflection of the charged particle beam 51e, and secondary electrons from the pattern element 17b are detected by the electron detector 30 while the charged particle beam 51e is deflected, as shown in FIG. 5B. At this time, if the charged particle beam 51e closest to the pattern element 17b is set as a measurement charged particle beam, the time taken for the stage 11 to be positioned (the amount of movement of the stage 11) can be minimized. Also, since one pattern element 17b is measured using one charged particle beam 51e, the measurement operation is influenced by neither the incident angles nor intensities of the charged particle beams 51a to 51e. This makes it possible to accurately obtain the position of the pattern element 17b free from the occurrence of distortions or variations in the waveforms of detection signals output from the electron detector 30 (see FIG. 5B).

The position of the alignment mark 17 is then calculated based on the positions of the charged particle beams 51a and 51b, the amount of movement of the stage 11 in positioning the stage 11, and the positions of the pattern elements 17a and 17b. For example, let Pa and Pb be the positions of the charged particle beams 51a and 51b, respectively, Xs be the amount of movement of the stage 11, and Xa and Xb be the positions of the pattern elements 17a and 17b relative to the positions Pa and Pb, respectively. In this case, an interval Xp between the pattern elements 17a and 17b is given by:

$$Xp = (Pb + Xb) - (Pa + Xa) + Xs$$

Note that the positions Xa and Xb of the pattern elements 17a and 17b, respectively, can be obtained by specifying the positions of the two ends of each of the pattern elements 17a and 17b based on the detection result obtained by the electron detector 30.

In this manner, the drawing apparatus 100 can accurately measure the positions of the two pattern elements 17a and 17b which form the alignment mark 17 in a short time, and, in turn, can accurately obtain the position of the alignment mark 17.

Figure 6A:
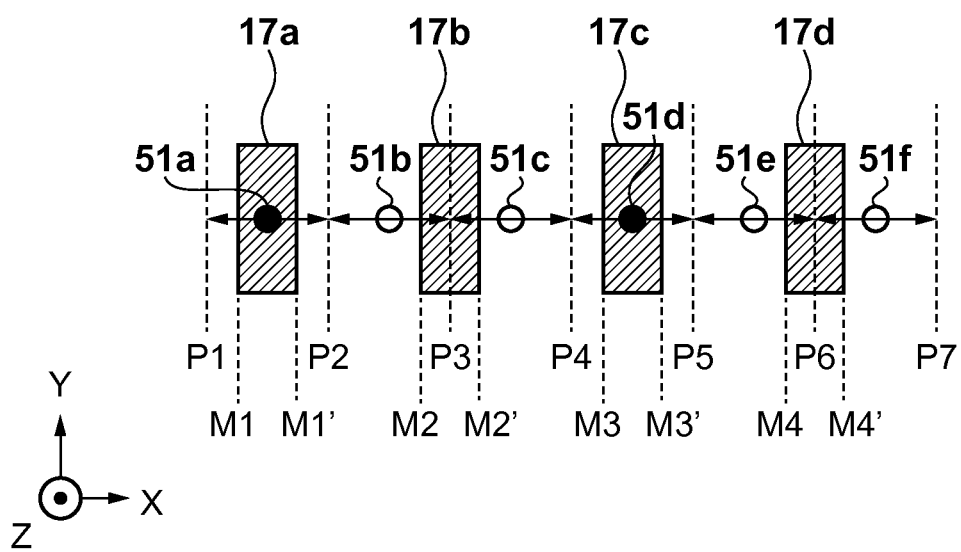
FIGS. 6A and 6B are views for explaining a process of obtaining the position of an alignment mark formed by four pattern elements.
Figure 6B:
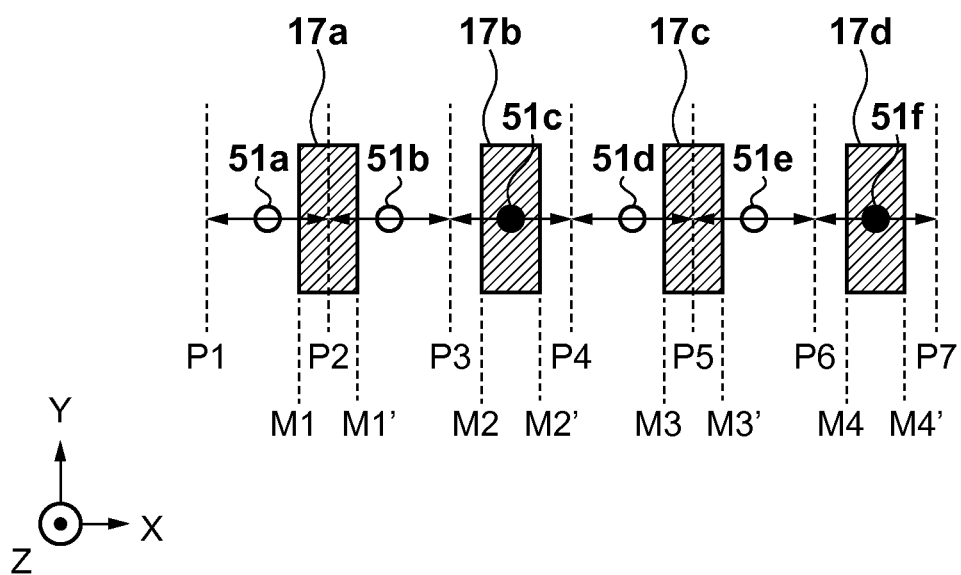

A process of obtaining the position of an alignment mark 17 formed by four pattern elements 17a, 17b, 17c, and 17d in the drawing apparatus 100 will be described next with reference to FIGS. 6A and 6B. In this case, six charged particle beams 51a, 51b, 51c, 51d, 51e, and 51f are selected as at least two charged particle beams for measuring the pattern elements 17a to 17d. FIGS. 6A and 6B show the positional relationship between the six charged particle beams 51a to 51f and the four pattern elements 17a to 17d which form the alignment mark 17. For the sake of simplicity, the case wherein the interval between the pattern elements 17a to 17d is narrower than that between the pattern elements 17a and 17b shown in FIGS. 5A and 5B will be described herein. Referring to FIGS. 6A and 6B, charged particle beams which do not strike the substrate 10 upon a blanking operation are indicted by open circles, and other charged particle beams which strike the substrate 10 upon the blanking operation are indicated by filled circles. Note that the range of deflection of the charged particle beam 51a is defined by dotted lines P1 and P2, that of the charged particle beam 51b is defined by dotted lines P2 and P3, and that of the charged particle beam 51c is defined by dotted lines P3 and P4. Similarly, the range of deflection of the charged particle beam 51d is defined by dotted lines P4 and P5, that of the charged particle beam 51e is defined by dotted lines P5 and P6, and that of the charged particle beam 51f is defined by dotted lines P6 and P7.

Referring to FIG. 6A, two ends M1 and M1' of the pattern element 17a fall within the range of deflection of the charged particle beam 51a, and two ends M3 and M3' of the pattern element 17c fall within the range of deflection of the charged particle beam 51d. Therefore, the positions of the pattern elements 17a and 17c can be measured by setting the charged particle beams 51a and 51d as measurement charged particle beams for the pattern elements 17a and 17c, and sequentially deflecting the charged particle beams 51a and 51d. Note that in FIG. 6A, there is no need to sequentially position the stage 11 so that the two ends M1 and M1' of the pattern element 17a, and the two ends M3 and M3' of the pattern element 17c fall within the ranges of deflection of the charged particle beams 51a and 51d, respectively.

One of the charged particle beams 51b, 51c, 51e, and 51f other than the charged particle beams 51a and 51d is set as a measurement charged particle beam for the pattern element 17b. At this time, a charged particle beam close to the pattern element 17b than the charged particle beams 51a and 51d and, more specifically, the charged particle beam 51c closest to the pattern element 17b is preferably set as a measurement charged particle beam at the end of the process of measuring the pattern elements 17a and 17c. The stage 11 is then positioned so that the two ends M2 and M2' of the pattern element 17b fall within the range of deflection of the charged particle beam 51c, as shown in FIG. 6B. Referring to FIG. 6B, two ends M4 and M4' of the pattern element 17d fall within the range of deflection of the charged particle beam 51f upon such positioning of the stage 11. Therefore, the positions of the pattern elements 17b and 17d can be measured by sequentially deflecting the charged particle beams 51c to 51f relative to the pattern elements 17b and 17d. At this time, there is no need to sequentially position the stage 11 so that the two ends M4 and M4' of the pattern element 17d fall within the range of deflection of the charged particle beam 51f.

The position of the alignment mark 17 is calculated based on the positions of the charged particle beams 51a, 51c, 51d, and 51f, the amount of movement of the stage 11 in positioning the stage 11, and the positions of the pattern elements 17a to 17d.

In this manner, the positions of a plurality of pattern elements can also often be measured by sequentially deflecting a plurality of charged particle beams in one positional relationship between the charged particle beams 51 and the pattern elements which form the alignment mark 17. In such a case, compared to the case wherein the stage 11 is positioned relative to each pattern element, positioning of the stage 11 need only be repeated fewer times, so the position of the alignment mark 17 can be obtained in a shorter time.

Note that since the alignment mark 17 is formed by a plurality of pattern elements, it is desired to detect secondary electrons by the electron detector 30 for each pattern element while shifting the timings of deflection of respective charged particle beams by the blanking deflectors 6 in measuring the positions of the pattern elements. However, secondary electrons may be individually detected by the electron detector 30 by deflecting a plurality of charged particle beams, with which the substrate 10 is irradiated at different positions in the direction in which the stage 11 moves (Y-direction), relative to the alignment mark 17 (pattern elements) at different timings.

Although a process of obtaining the position of an X-mark having a longitudinal direction in the Y-direction has been described above as a process of obtaining the position of the alignment mark 17, the present invention is not limited to this. The present invention is also applicable to, for example, a process of obtaining the position of an alignment mark tilted by ±45° with respect to the X-direction within the X-Y plane, or a process of obtaining the position of a Y-mark having a longitudinal direction in the X-direction. The present invention is moreover applicable to a process of measuring the positions of a plurality of pattern elements which form the reference mark formed on the reference plate 15 (that is, a process of obtaining the position of this reference mark).

The drawing apparatus 100 according to this embodiment can accurately obtain the position of the alignment mark 17 in a short time, as described above. Hence, the drawing apparatus 100 can shorten the time taken for the charged particle beams and the substrate 10 to be aligned with each other, and, in turn, can accurately perform a process of drawing a pattern on the substrate 10 while preventing a decrease in throughput.

<Second Embodiment>

Figure 7:
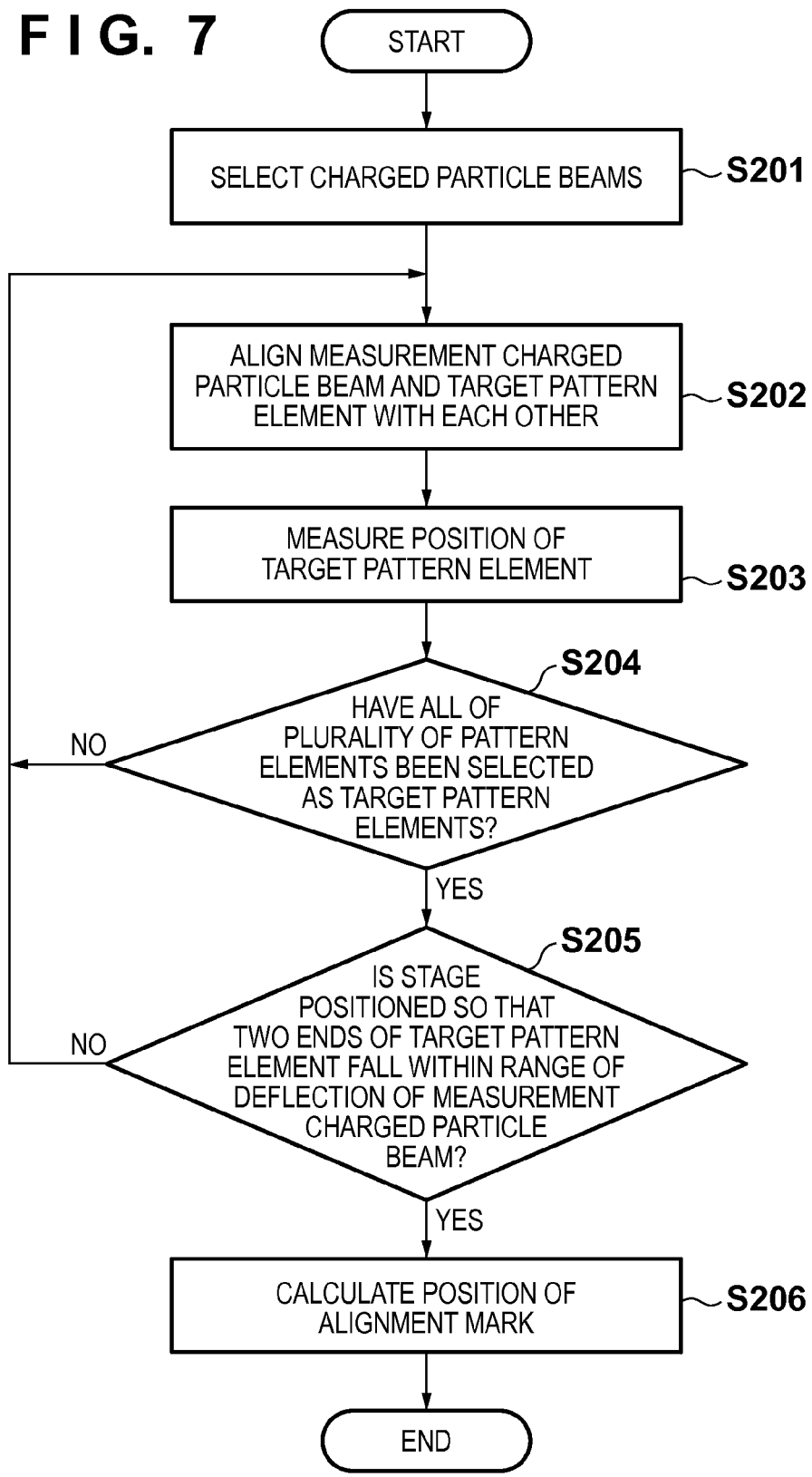
FIG. 7 is a flowchart for explaining a process of obtaining the position of the alignment mark in the drawing apparatus shown in FIG. 1.

An alignment process and, more particularly, a process of obtaining the position of an alignment mark 17 in the second embodiment will be described with reference to FIG. 7. A main controller 26 performs this process by controlling each unit of a drawing apparatus 100 as a whole, as described above. Note that steps S201, S202, S203, S204, and S206 are the same as steps S101, S102, S103, S104, and S105, respectively, shown in FIG. 4, and a description thereof will not be given.

In step S205, it is determined whether a stage 11 is positioned so that the two ends of the target pattern fall within the range of deflection of the measurement charged particle beam in step S202 for each of a plurality of patterns which form the alignment mark 17. This determination operation is performed based on the detection result obtained by an electron detector 30, that is, a detection signal output from the electron detector 30 in step S203. If it is determined in step S205 that the stage 11 is positioned so that the two ends of the target pattern fall within the range of deflection of the measurement charged particle beam, the process advances to step S206. On the other hand, if it is determined in step S205 that the stage 11 is not positioned so that the two ends of the target pattern fall within the range of deflection of the measurement charged particle beam, the process returns to step S202, in which a process of measuring the target pattern element is performed again.

The drawing apparatus 100 performs initial calibration based on the measurement results of various marks obtained using the charged particle beams. At this time, due, for example, to position errors of the stage 11 or manufacturing errors of a charged particle optical system 80, a shift may occur in the positional relationship between the charged particle beams and the alignment mark 17 (pattern elements which form it). In such a case, when the position of the alignment mark 17 is obtained without correcting the shift in positional relationship between the charged particle beams and the alignment mark 17, an error may occur in the measurement result due, for example, to asymmetry or distortion in the waveform of a detection signal output from the electron detector 30.

Hence, in this embodiment, if it is determined in step S205 that the stage 11 is not positioned so that the two ends of the target pattern fall within the range of deflection of the measurement charged particle beam, the process returns to step S202, in which the shift in positional relationship between the charged particle beams and the alignment mark 17 is corrected. More specifically, in step S202, the stage 11 is aligned based on the positions of the two ends of the target pattern element specified based on the detection result obtained by the electron detector 30 in step S203. When, for example, the target pattern element is only partially specified, the stage 11 is positioned again in accordance with the amount of shift in positional relationship corresponding to the specifying result, so that the two ends of the target pattern element fall within the range of deflection of the measurement charged particle beam. In other words, the positioning operation of the stage 11 is repeated until the shift in positional relationship between the charged particle beams and the alignment mark 17 is corrected, thereby reliably positioning the two ends of the target pattern elements to fall within the range of deflection of the measurement charged particle beam. Upon this operation, the influence of a shift in positional relationship between the charged particle beams and the alignment mark 17 (that is, degradation in measurement accuracy) can be reduced more, thereby more accurately obtaining the position of the alignment mark 17 in the second embodiment than in the first embodiment.

Although the stage 11 is positioned again to correct the shift in positional relationship between the charged particle beams and the alignment mark 17 in this embodiment, the present invention is not limited to this. For example, of at least two charged particle beams selected in step S201, a charged particle beam (another charged particle beam) different from the charged particle beam set as a measurement charged particle beam in step S202 may be set as a new measurement charged particle beam.

<Third Embodiment>

Figure 8:
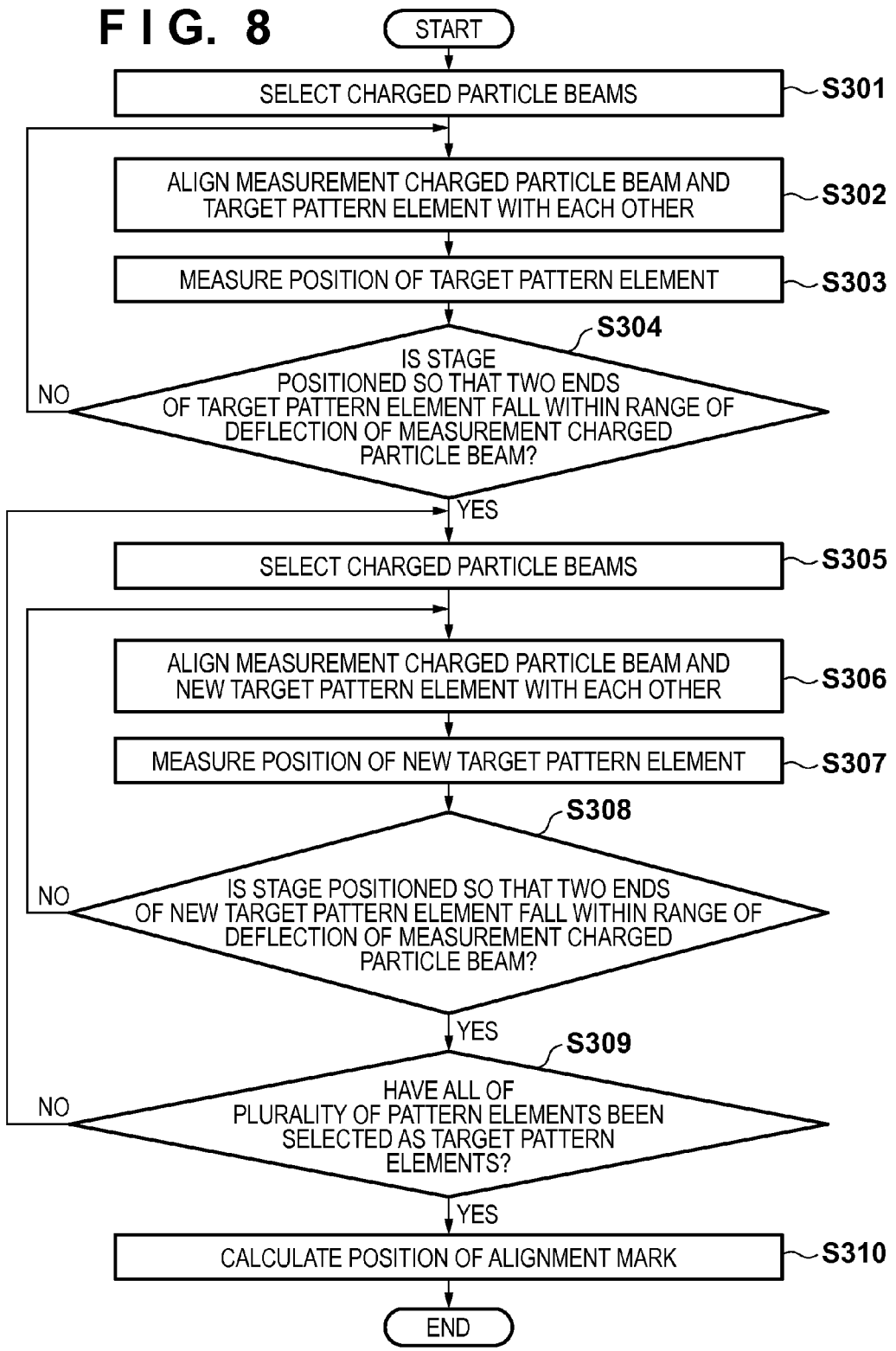
FIG. 8 is a flowchart for explaining a process of obtaining the position of the alignment mark in the drawing apparatus shown in FIG. 1.
Figure 9:
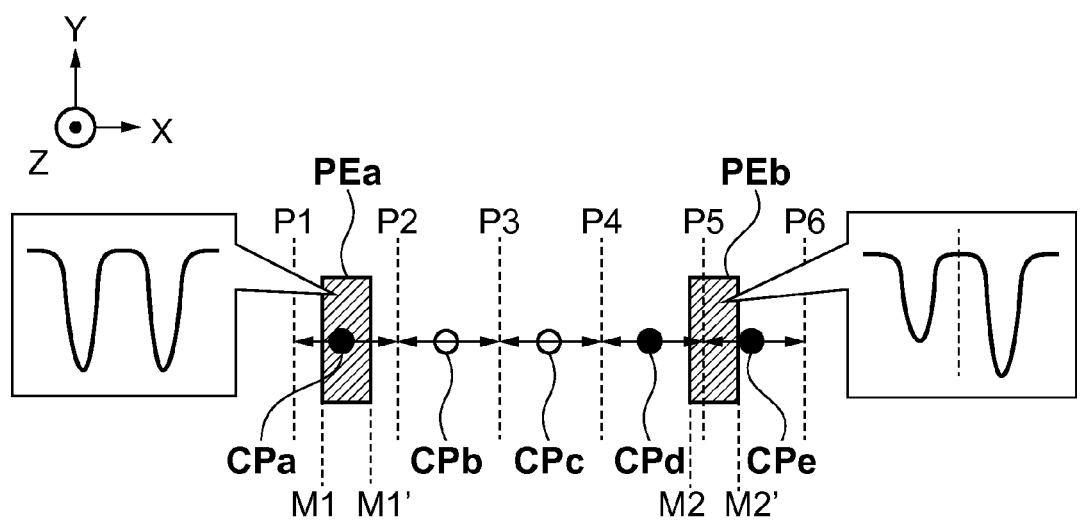
FIG. 9 is a view for explaining measurement of an alignment mark according to the related art technique.

An alignment process and, more particularly, a process of obtaining the position of an alignment mark 17 in the third embodiment will be described with reference to FIG. 8. A main controller 26 performs this process by controlling each unit of a drawing apparatus 100 as a whole, as described above. Note that step S310 is the same as step S105 shown in FIG. 4, and a description thereof will not be given.

In step S301, charged particle beams for measuring one target pattern element among a plurality of pattern elements which form the alignment mark 17 are selected from a plurality of charged particle beams 51 having passed through an aperture array 4.

In step S302, a measurement charged particle beam and the target pattern element selected from the plurality of pattern elements which form the alignment mark 17 are aligned with each other. More specifically, first, of the charged particle beams selected in step S301, one charged particle beam close to the target pattern element is set as a measurement charged particle beam for the target pattern element. A stage 11 is then positioned so that the two ends of the target pattern element fall within the range of deflection of the measurement charged particle beam by a deflector 8.

In step S303, the position of the target pattern element is measured. More specifically, first, secondary electrons from the target pattern element are detected by an electron detector 30 while the measurement charged particle beam is deflected by the deflector 8, as the stage 11 is positioned in step S302. The positions of the two ends of the target pattern element are then specified (that is, the position of the target pattern element is obtained) based on the detection result obtained by the electron detector 30.

In step S304, it is determined whether the stage 11 is positioned so that the two ends of the target pattern element fall within the range of deflection of the measurement charged particle beam in step S302. This determination operation is performed based on the detection result obtained by the electron detector 30, that is, a detection signal output from the electron detector 30 in step S303. If it is determined in step S304 that the stage 11 is positioned so that the two ends of the target pattern fall within the range of deflection of the measurement charged particle beam, the process advances to step S305. On the other hand, if it is determined in step S304 that the stage 11 is not positioned so that the two ends of the target pattern fall within the range of deflection of the measurement charged particle beam, the process returns to step S302. Then, the stage 11 is positioned again, or a new measurement charged particle beam is set, and a process of measuring the target pattern element is performed again, as described in the second embodiment.

In step S305, charged particle beams for measuring a new target pattern element among the plurality of pattern elements which form the alignment mark 17 are selected from the plurality of charged particle beams 51 having passed through the aperture array 4. The new target pattern element means herein a pattern element other than pattern elements at already measured positions, that is, a pattern element at a position to be measured.

In step S306, a measurement charged particle beam and the new target pattern element selected from the plurality of pattern elements which form the alignment mark 17 are aligned with each other. More specifically, first, of the charged particle beams selected in step S305, one charged particle beam close to the new target pattern element is set as a measurement charged particle beam for the new target pattern element. The stage 11 is then positioned so that the two ends of the target pattern element fall within the range of deflection of the measurement charged particle beam by the deflector 8. At this time, a measurement charged particle beam is set and the stage 11 is positioned, based on the positions of the two ends of the pattern element at an already measured position (for example, the positions of the two ends of the pattern element specified in step S303).

In step S307, the position of the new target pattern element is measured. More specifically, first, secondary electrons from the new target pattern element are detected by the electron detector 30 while the measurement charged particle beam is deflected by the deflector 8, as the stage 11 is positioned in step S306. The positions of the two ends of the new target pattern element are specified based on the detection result obtained by the electron detector 30 (that is, the position of the new target pattern element is obtained).

In step S308, it is determined whether the stage 11 is positioned so that the two ends of the new target pattern element fall within the range of deflection of the measurement charged particle beam in step S306. This determination operation is performed based on the detection result obtained by the electron detector 30, that is, a detection signal output from the electron detector 30 in step S307. If it is determined in step S308 that the stage 11 is positioned so that the two ends of the target pattern fall within the range of deflection of the measurement charged particle beam, the process advances to step S309. On the other hand, if it is determined in step S308 that the stage 11 is not positioned so that the two ends of the target pattern fall within the range of deflection of the measurement charged particle beam, the process returns to step S306. Then, the stage 11 is positioned again, or a new measurement charged particle beam (another charged particle beam) is set, and a process of measuring the new target pattern element is performed again, as described in the second embodiment.

In step S309, it is determined whether all of the plurality of pattern elements which form the alignment mark 17 have been selected as target pattern elements. If it is determined in step S309 that not all of the plurality of pattern elements have been selected as target pattern elements, a new target pattern element is selected from the plurality of remaining pattern elements, and the process returns to step S305. On the other hand, if it is determined in step S309 that all of the plurality of pattern elements which form the alignment mark 17 have been selected as target pattern elements, the process advances to step S310.

In this embodiment, in measuring the plurality of pattern elements which form the alignment mark 17, a measurement charged particle beam is set and the stage 11 is positioned, based on the measurement result of one pattern element (that is, the position of this pattern element). A measurement charged particle beam is set based on the positions of the plurality of charged particle beams 51 on a substrate 10, and those of the plurality of pattern elements which form the alignment mark 17, so that the stage 11 moves only in a small amount in positioning the stage 11, as described above. Note that the position of the alignment mark 17 can be obtained by measurement after the substrate 10 moves onto the optical axis of the alignment optical system 12. On the other hand, when the position of the alignment mark 17 is obtained using the charged particle beams, measurement is performed after the substrate 10 moves onto the optical axis of the charged particle optical system 80. It is therefore necessary to move the substrate 10 (stage 11) onto the optical axis of the charged particle optical system 80 based on the position of the alignment mark 17 measured by the alignment optical system 12. However, if the stage 11 has a movement error, the two ends of the target pattern element may not fall within the range of deflection of the measurement charged particle beam as a shift occurs in the position of the alignment mark 17 (that is, as an error occurs in positioning the stage 11). To prevent this problem, in this embodiment, a measurement charged particle beam is set and the stage 11 is positioned, based on the measurement result obtained by one pattern element.

In the second embodiment, it is determined whether the stage 11 is positioned so that the two ends of the target pattern element fall within the range of deflection of the measurement charged particle beam, at the end of all of the plurality of pattern elements which form the alignment mark 17. Therefore, if even one target pattern element has two ends which do not fall within the range of deflection of the measurement charged particle beam, all of the plurality of pattern elements must be measured again.

On the other hand, in this embodiment, it is determined whether the stage 11 is positioned so that the two ends of the target pattern element fall within the range of deflection of the measurement charged particle beam, at the end of measurement of one pattern element. Therefore, if the two ends of a certain target pattern element do not fall within the range of deflection of the measurement charged particle beam, only this target pattern element need only be measured again. Upon this operation, the time taken for the plurality of pattern elements which form the alignment mark 17 to be measured can be reduced more, thereby obtaining the position of the alignment mark 17 in a shorter time in the third embodiment than in the second embodiment.

A method of manufacturing an article according to an embodiment of the present invention is suitable for manufacturing various articles including a microdevice such as a semiconductor device and an element having a microstructure. This method includes a step of forming a latent image pattern on a photosensitive agent, applied on a substrate, using the above-mentioned drawing apparatus 100 (a step of performing drawing on a substrate), and a step of developing the substrate having the latent image pattern formed on it in the forming step. This method also includes subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-289885 filed on Dec. 28, 2011, which is hereby incorporated by reference herein in its entirety.

What is claimed is:

1. A drawing apparatus which performs drawing on a substrate with a plurality of charged particle beams, the apparatus comprising:
   a stage configured to hold the substrate and to be moved;
   a charged particle optical system including a deflector configured to deflect the plurality of charged particle beams;
   a detector configured to detect a charged particle arrived thereat by causing a charged particle beam to impinge on a mark including first and second mark elements formed on one of the substrate and the stage with the charged particle beam undergoing deflection thereof by the deflector; and
   a processor configured to perform a process of obtaining a position of the mark,
   wherein the processor is configured to control the stage, the charged particle optical system, and the detector such that a position of the first mark element is measured while two ends of the first mark element fall within a range of deflection by the deflector with respect to a first charged particle beam among the plurality of charged particle beams, and a position of the second mark element, different from the first mark element, is measured while two ends of the second mark element fall within a range of deflection by the deflector with respect to a second charged particle beam, among the plurality of charged particle beams, closer to the second mark element than the first charged particle beam.

2. The apparatus according to claim 1, wherein the processor is configured to select, as the second charged particle beam, a charged particle beam closest to the second mark element among the plurality of charged particle beams, based on the measured position of the first mark element.

3. The apparatus according to claim 1, wherein the processor is configured to control the stage based on the measured position of the first mark element, so that the two ends of the second mark element fall within the range of deflection by the deflector with respect to the second charged particle beam.

4. The apparatus according to claim 1, wherein the processor is configured, based on measurement of the first mark element, to determine whether the stage is positioned so that the two ends of the first mark element fall within the range of deflection by the deflector with respect to the first charged particle beam, and to control, if the processor determines that the stage is not positioned as such, the stage, the charged particle optical system, and the detector such that the position of the first mark element is measured using one of the first charged particle beam and another charged particle beam.

5. The apparatus according to claim 1, wherein the processor is configured, based on measurement of the second mark element, to determine whether the stage is positioned so that the two ends of the second mark element fall within the range of deflection by the deflector with respect to the second charged particle beam, and to control, if the processor determines that the stage is not positioned as such, the stage, the charged particle optical system, and the detector such that the position of the second mark element is measured using one of the second charged particle beam and another charged particle beam.

6. A method of manufacturing an article, the method comprising:
performing drawing on a substrate using a drawing apparatus;
developing the substrate on which the drawing has been performed; and
processing the developed substrate to manufacture the article,
wherein the drawing apparatus performs the drawing on the substrate with a plurality of charged particle beams, and includes
a stage configured to hold the substrate and to be moved;
a charged particle optical system including a deflector configured to deflect the plurality of charged particle beams;
a detector configured to detect a charged particle that arrives thereat by causing a charged particle beam to impinge on a mark including first and second mark elements formed on one of the substrate and the stage with the charged particle beam undergoing deflection thereof by the deflector; and
a processor configured to perform a process of obtaining a position of the mark,
wherein the processor is configured to control the stage, the charged particle optical system, and the detector such that a position of the first mark element is measured while two ends of the first mark element fall within a range of deflection by the deflector with respect to a first charged particle beam among the plurality of charged particle beams, and a position of the second mark element is measured while two ends of the second mark element fall within a range of deflection by the deflector with respect to a second charged particle beam, among the plurality of charged particle beams, closer to the second mark element than the first charged particle beam.

* * * * *